US008222669B2

(12) United States Patent
Khan et al.

(10) Patent No.: US 8,222,669 B2
(45) Date of Patent: Jul. 17, 2012

(54) MIXED SOURCE GROWTH APPARATUS AND METHOD OF FABRICATING III-NITRIDE ULTRAVIOLET EMITTERS

(75) Inventors: Asif Khan, Irmo, SC (US); Qhalid Fareed, Irmo, SC (US)

(73) Assignee: Nitek, Inc., Irmo, SC (US)

( * ) Notice: Subject to any disclaimer, the term of this patent is extended or adjusted under 35 U.S.C. 154(b) by 0 days.

(21) Appl. No.: 12/934,488

(22) PCT Filed: Mar. 27, 2009

(86) PCT No.: PCT/US2009/038603
§ 371 (c)(1),
(2), (4) Date: Feb. 5, 2011

(87) PCT Pub. No.: WO2009/120986
PCT Pub. Date: Oct. 1, 2009

(65) Prior Publication Data
US 2011/0127571 A1    Jun. 2, 2011

Related U.S. Application Data

(60) Provisional application No. 61/070,975, filed on Mar. 27, 2008.

(51) Int. Cl.
*H01L 33/40*     (2010.01)
*H01L 33/02*     (2010.01)

(52) U.S. Cl. ........................................ 257/103
(58) Field of Classification Search .......... 257/13, 257/79–103, 918, E51.018–E51.022, E33.001–E33.077, 257/E33.054, E25.028, E25.032, E33.023; 438/22–47, 69, 493, 503, 507, 956; 118/725
See application file for complete search history.

(56) References Cited

U.S. PATENT DOCUMENTS

| 6,569,765 | B1  |    | 5/2003  | Solomon et al. |
| 6,924,159 | B2  | *  | 8/2005  | Usui et al. ........................ 438/22 |
| 7,674,699 | B2  | *  | 3/2010  | Shibata .......................... 438/602 |
| 7,777,217 | B2  | *  | 8/2010  | Preble et al. ..................... 257/21 |
| 7,833,346 | B2  | *  | 11/2010 | Imaeda et al. ................... 117/64 |
| 7,981,713 | B2  | *  | 7/2011  | Shibata .......................... 438/47 |
| 8,026,156 | B2  | *  | 9/2011  | Lee et al. ....................... 438/481 |
| 8,053,811 | B2  | *  | 11/2011 | Hiramatsu et al. ............ 257/190 |
| 8,102,026 | B2  | *  | 1/2012  | Eri et al. ....................... 257/615 |

OTHER PUBLICATIONS

Lee, Byul Sup, PCT/US2009/038603 International Search Report and Written Opinion for Nitek, Inc. et al., Oct. 29, 2009.

* cited by examiner

*Primary Examiner* — Dao H Nguyen
*Assistant Examiner* — Tram H Nguyen
(74) *Attorney, Agent, or Firm* — Joseph T. Guy; Nexsen Pruet, LLC

(57) ABSTRACT

A device for forming a Group III-V semiconductor on a substrate. The device has a primary chamber comprising a substrate and a heat source for heating the substrate to a first temperature. A secondary chamber comprises a metal source and a second heat source for heating the secondary chamber to a second temperature. A first source is provided which is capable of providing HCl to the secondary chamber wherein the HCl and the metal form metal chloride. A metal-organic source is provided. A metal chloride source is provided which comprises a metal chloride. At least one of the metal chloride, the metal-organic and the second metal chloride react with the nitrogen containing compound to form a Group III-V semiconductor on the substrate.

31 Claims, 5 Drawing Sheets

MIXED SOURCE GROWTH APPARATUS AND METHOD OF FABRICATING III-NITRIDE ULTRAVIOLET EMITTERS

CROSS-REFERENCE TO RELATED APPLICATIONS

The present invention claims priority to U.S. Provisional Patent Application No. 61/070,975 filed Mar. 27, 2008.

BACKGROUND OF THE INVENTION

The present invention relates generally to a mixed source growth apparatus which is particularly suitable for preparation of Group III nitride ultraviolet emitters.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting diode or a laser diode that emits blue light may be used for displays, for lighting and for high-density optical disk devices. A light-emitting device (which together with the acronym LED, when used herein, will for convenience also refer to both a light-emitting diode and laser diode unless otherwise specified) that emits ultraviolet radiation is expected to find applications in the field of ultraviolet curing, phototherapy, water and air purification, bio-detection, and germicidal treatment. The ultraviolet portion of the electromagnetic spectrum is often subdivided by wavelength into UVA (315-380 nm), UVB (280-315 nm) and UVC (<280 nm).

Group III nitride semiconductors are typically manufactured by incorporation of vapor phase reactants in a reaction chamber. Particularly suitable techniques include Hydride Vapor Phase Epitaxy (HVPE) and Metal-Organic Chemical Vapor phase Epitaxy (MOCVD) both of which are well known in the art.

HVPE is a favored technique for GaN deposition. It provides relatively rapid growth in a cost-effective manner. In HVPE growth of GaN proceeds due to the high temperature, vapor-phase reaction between gallium chloride and ammonia. GaCl is typically produced by passing HCl over a heated liquid gallium supply. The two gases are directed towards a heated substrate and reaction occurs to produce solid GaN on the substrate surface.

With MOCVD growth a nitrogen source, such as ammonia gas, is reacted with metallo-organic compounds at high temperatures above or on a substrate leading to deposition of a solid semiconductor HVPE and MOCVD are complementary techniques which are not totally compatible. There has been some desire to utilize both techniques during the layer build up in an LED but the incompatibility has made this task difficult. One method for incorporating both techniques includes the transfer of material from an HVPE device to a MOCVD device between subsequent steps. This requires the materials to be maintained in a clean area during transfer, which is cumbersome, and greatly complicates manufacturing.

There have been some efforts to form a hybrid system wherein components of a HVPE device and components of a MOCVD device are merged into a single reactor. This technique is exemplified in U.S. Pat. No. 6,569,765. While advantageous, this system has significant limitations which have prohibited its widespread use. In particular, particle free and pre-reaction free III-nitride layers are difficult to prepare in such a device. A further problem is that pulse atomic layer epitaxy growth are not easily accomplished due to the complexity associated with flow control through the various interlinked reactor supply vessels.

Incorporation of aluminum is particularly difficult. HVPE growth requires a high temperature. The reaction vessels employed are quartz which can react violently with aluminum at the usual temperatures employed. Therefore, with a design as detailed in U.S. Pat. No. 6,569,765 it is very difficult, if not impossible, to incorporate aluminum.

Efforts to thermally segment the reaction chamber have met with limited success. To have any significant temperature gradient the zones must be sufficiently separated to allow control. It is very difficult to have thermal zones without some cool zones. The cool zones cause condensation which is undesirable.

There has been an ongoing desire for a single apparatus wherein HVPE and MOCVD growth can occur on a substrate simultaneously, or sequentially, without the substrate being removed, without premature precipitation and without the risk of unintended reactions or reactions which are not advantageous.

SUMMARY OF THE INVENTION

It is an object of the present invention to provide an improved system for preparing Group III-V semiconductors on a substrate.

It is another object of the present invention to provide a method of preparing Group III-V semiconductors on a substrate.

In a particularly preferred embodiment the Group III-V semiconductors are formed as a UV or deep-UV light emitting diode with minimal crystal defects.

A particular advantage is the ability to form a Group III-V semiconductor on a substrate with minimal defects. More specifically defects originating from premature, typically gas phase, reaction are mitigated.

These and other advantages, as will be realized, are provided in a method of forming a Group III-V semiconductor crystal layer over a substrate comprising the steps of:
heating a substrate in a chamber to a first temperature;
supplying a gaseous flow of a metal-organic compound to the chamber;
passing hydrogen chloride gas over a metal source at a second temperature to form a metal chloride wherein the second temperature is lower than the first temperature;
supplying the metal chloride to the chamber; and
supplying a gaseous flow of a nitrogen source to the chamber; wherein at least one of the metal chloride and the metal-organic reacts with nitrogen of the nitrogen source to form a Group III-V semiconductor crystal layer on the substrate.

Yet another advantage is provided in a device for forming a Group III-V semiconductor on a substrate. The device has a primary chamber comprising a substrate and a heat source for heating the substrate to a first temperature. A secondary chamber comprises a metal source and a second heat source for heating the secondary chamber to a second temperature. The second temperature is lower than the first temperature. A first source is provided which is capable of providing HCl to the secondary chamber wherein the HCl and the metal form metal chloride. A first carrier gas is provided which is capable of transporting the metal chloride to the primary chamber. A metal-organic source is provided which is capable of containing a metal-organic. A second carrier gas is provided which is capable of transporting the metal-organic from the metal-organic source to the primary chamber. A second metal chloride source is provided which comprises a second metal chloride. A third carrier gas is provided which is capable of transporting the second metal chloride to the primary chamber. A nitrogen source is provided which comprises a nitrogen containing compound. A fourth carrier gas is provided which is capable of transporting the nitrogen containing compound to the primary chamber; At least one of the metal chloride, the metal-organic and the second metal chloride react with the nitrogen containing compound to form a Group III-V semiconductor on the substrate.

DETAILED DESCRIPTION OF PREFERRED EMBODIMENTS

The present invention is directed to a mixed source growth apparatus which is particularly suitable for the preparation of Group III nitride semiconductors and LED's manufactured therein.

The invention will be described with reference to the various figures forming an integral part of the instant disclosure. The figures, and descriptions thereof, refer specifically to preferred embodiments without limit thereto. Throughout the figures similar elements will be numbered accordingly.

Figure 1:
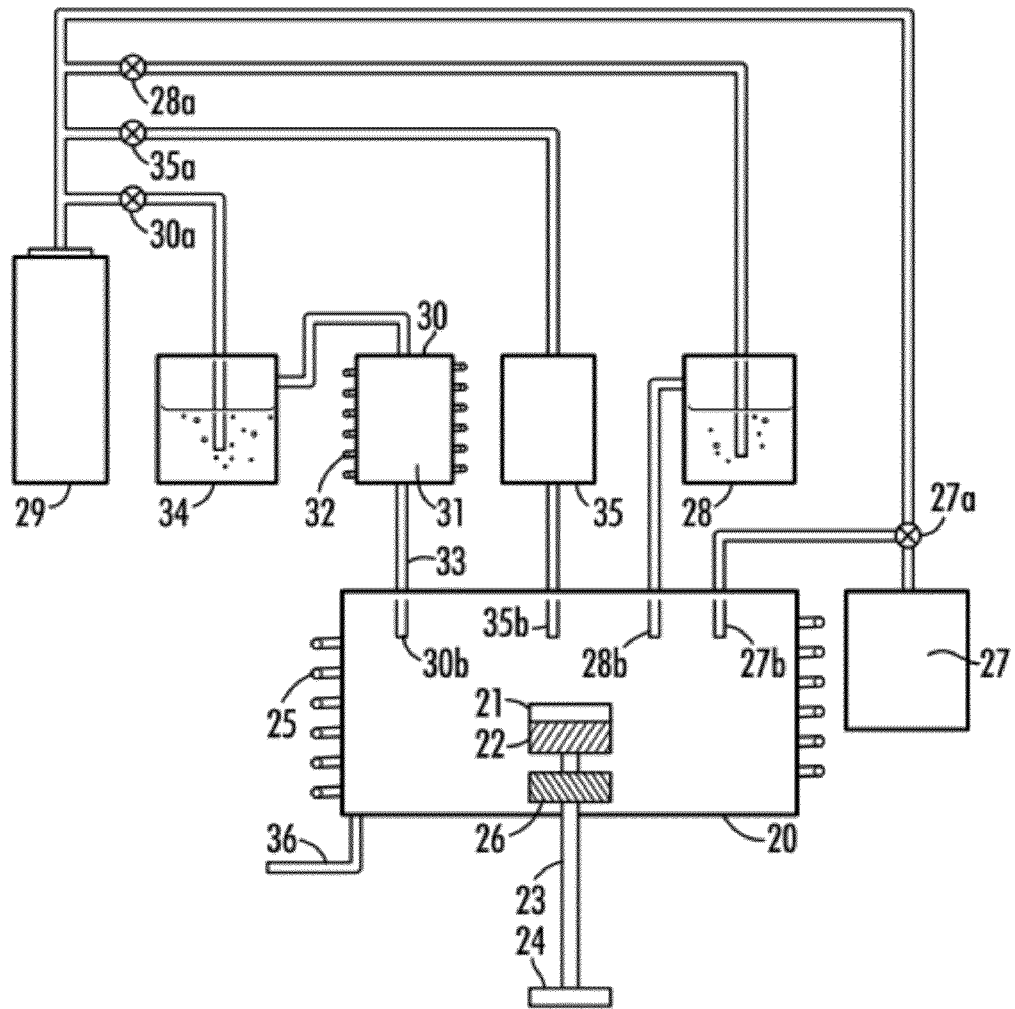
FIG. 1 is a schematic representation of an embodiment of the present invention.

An embodiment of the invention is illustrated schematically and will be described with reference to FIG. 1. In FIG. 1 the primary reaction chamber, 20, contains a substrate, 21, upon which growth of the Group III nitride occurs. The substrate is supported by a substrate holder, 22, which is preferably integral to a pedestal, 23. The pedestal allows the substrate to be rotated by an external rotation mechanism, 24, to eliminate concentration variations on the surface. The rotation mechanism is preferably remote to avoid heating of the rotation mechanism. As would be realized it is preferable to have a couple, such as a gear mechanism, or gas drive, between the pedestal and rotation mechanism to minimize transfer of heat by conduction. The substrate holder can hold a single wafer or multiple wafers. In a particularly preferred embodiment the substrate holder can be rotated using a mechanical rotation or gas-based rotation. Rotation is option but preferred, particularly, when large substrates are being prepared. The reaction between the precursors takes places inside the reactor chamber maintained at 40-760 torr and the substrate holder is heated from about 25° C. to 140° C.

As would be readily understood, and more clearly set forth herein, the chamber and sample must be heated. In one embodiment an external heater, 25, is employed. While represented as a cylindrical strip heater around the reaction chamber the heater can be a tube furnace or any heater sufficient to heat the primary reaction chamber to the temperatures necessary as will be set forth herein. In another embodiment an internal heater, 26, is employed. The internal heater has advantages over the external heater since the heat source is closer to the substrate. The internal heater provides more control over the temperature of the substrate since there is less interference by the material flow between the exterior of the primary reaction chamber and the substrate. A disadvantage of the internal heater is the possibility of material condensing thereon in some cases. Both heaters can be employed if desired.

There are three primary categories of components employed in the formation of the semiconductor. One component is the Group III material, typically Al, Ga or In. The second component is nitrogen. The Group III material and nitrogen form the Group III nitride. The third component is a dopant which can be a p-type dopant, an n-type dopant or other materials typically utilized in Group III nitride semiconductors as set forth herein.

Nitrogen is provided by source, 27, which has associated therewith a flow control valve, 27a. Nitrogen is preferably supplied directly to the primary reaction chamber, 20, exiting a source shower head, 20b. The preferred source of nitrogen is ammonia. Other materials containing nitrogen may be employed but ammonia is highly preferred due to the absence of contaminating reaction by-products. A carrier gas can be employed with the nitrogen source but this is not typically necessary. The carrier gas source is preferably connected to furnace which can be heated from 25 to 170° C.

A metallo-organic is provided by source, 28. Source, 28, receives a carrier gas supplied by a source, 29, which passes through a metallo-organic liquid. The metallo-organic liquid is then carried by the carrier gas into the primary reaction chamber exiting a source shower head, 29b, wherein it reacts with the nitrogen to form the Group III nitride. The flow of metallo-organic material is controlled by the flow of carrier gas into source 28 which is controlled by valve 28a. Trimethyl metal is the preferred metallo-organic material with the most preferred metallo-organic materials selected from the Group consisting of trimethyl aluminum, trimethyl gallium, triethylgallium, trimethyl indium, triethyl aluminum, triethyl indium, trimethyl boron and triethyl boron. The carrier gas is preferably a non-reactive gas more preferably selected from hydrogen, nitrogen or argon.

A primary advantage of the present invention is provided by the secondary reaction chamber, 30. Secondary reaction chamber, 30, comprises a molten material in a reaction boat, 31. The molten material preferably comprises hydrogen chloride and is passed over a metal source. The metal source comprises at least one of the group selected from gallium, aluminum, indium, magnesium, and boron. Carrier gas from source, 29, is flowed through source, 34, whereby HCl is carried into the secondary reaction chamber exiting a source shower head, 30b. In the secondary reaction chamber the HCl and molten Group III material are allowed to react. A heater, 32, maintains the temperature of the chamber at the appropriate reaction temperature. The secondary reaction chamber is connected to the reactor chamber and heated more than 50 C-600° C. outside the reactor chamber. The secondary reaction chamber is more preferably heated from 100 to 150° C. The Group III halide is then carried by the carrier gas from the secondary reaction chamber, 30, into the primary reaction chamber, 20, wherein the reaction to form the Group III nitride occurs. A transport tube, 33, between the secondary reaction chamber and primary reaction chamber comprises a heat source to prohibit condensation of material on the interior thereof. As would be realized it is preferable that the length of transport tube, 33, be as short as feasible with the proviso that the distance must be sufficient to allow adequate temperature control of both the primary reaction chamber and the secondary reaction chamber with minimal thermal interference there between. Flow of the Group III halide is controlled, in part, by controlling the flow of the carrier gas by valve, 30a. The secondary reaction chamber allows metal chloride formation at a lower temperature than that of the primary reaction chamber. This mitigates premature reaction between the metal chloride and nitrogen source which can occur in the vapor phase if the temperature of the metal chloride is to high.

Metal chloride can be added directly from source, 35, by carrier gas flowing there through and exiting a source shower head, 35a. The flow of carrier gas is controlled by valve, 35a. Whereas the metal halide sources is connected to the reactor chamber and heated more than 50 C-600° C. outside the reactor chamber;

The primary chamber, 20, has an exhaust port, 36, wherein unreacted precursor and reaction by-products are exhausted from the chamber.

It would be apparent that each supply source can be duplicated thereby allowing multiple materials to be flowed simultaneously or in a predetermined order and that the order of flow for each can be independently controlled.

Figure 2:
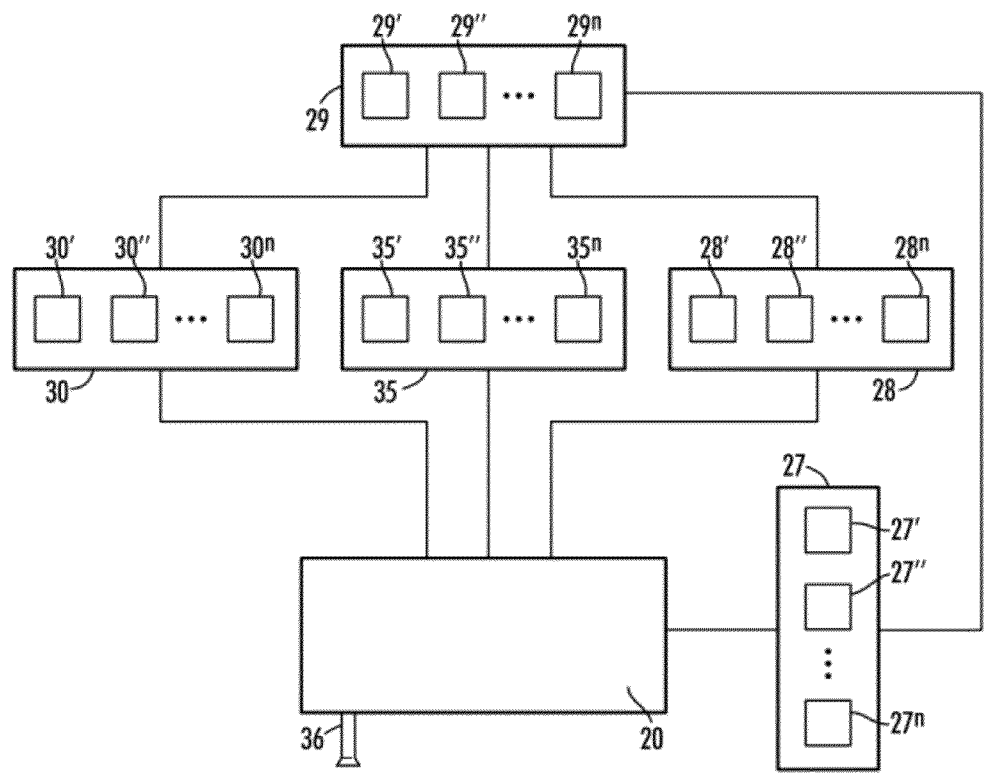
FIG. 2 is a schematic representation of another embodiment of the present invention.

With reference to FIG. 2, source, 30, may comprise a multiplicity of independent, parallel, sources. Similarly, source 35, source 28 and source 27 may comprise a multiplicity of independent, parallel sources. The carrier gas source, 29, may be a single source, multiple sources or a single source through a manifold for independent control. A carrier gas source may be provided for each independent source or for combinations of sources.

The inventive growth apparatus preferably comprises at least 4 precursor source inlets. The growth system preferably comprises at least three independent heating units with at least one heating unit suitable for heating the substrate holder, at least a second heating unit for heating the metal-chloride source and a third heating source for heating the metal source. The growth apparatus comprises a reactor chamber and a delivery manifold having sufficient inlets coupled to the reactor chamber. The growth apparatus has a gas outlet coupled with the reactor chamber to allow exhausting of gases after they have passed through the chamber.

The metallic source can be a solid, liquid or vapor with HCl gas flowing through a, preferably molten, metal to from the reactant.

The inventive growth apparatus can be operated in HVPE mode, in MOCVD mode, Pulsed atomic layer epitaxy (PALE) mode and in HVPE, MOCVD and PALE sequentially, simultaneously and alternately and also repeatedly. The valves, 27a, 28a, 30a and 35a can be manually activated or mechanically controlled. Mechanically controlled activation is preferred due to the improvements in process control and the ability to couple the controllers to a computer. The valves are particularly suitable for pulsing, or modulating, the flow of precursor into chamber.

Each source is preferably mounted outside the primary reaction chamber, however, each can be independently or collectively mounted inside the reactor chamber or coupled to each other.

It is preferred that there is a set distance between each source shower head and the substrate and most preferably each source shower head is the same distance from the substrate. The distance between the source shower head and the substrate is preferably about 1 mm to 1 meter.

The inventive system is capable of depositing Group III-Nitride layer at growth rates ranging from 0.001 μm-500 μm per hour achieving thicknesses of 0.001 μm-10 mm without removing the substrate from the chamber.

Group III-Nitride layers at preferably growth at temperatures ranging from 400 C to 1800° C. at pressures ranging from 30 Torr to 800 Torr.

A particular advantage of the inventive method is the flexibility provided. The multi-source growth system is capable of depositing Group III-Nitride layer by flowing metalorganic source and ammonia in one step and metal chloride/HCl passed over to metal source and ammonia in second step without changing the growth conditions and without removal of substrates from the primary chamber. A Group III-Nitride layer can be deposited by flowing only metalorganic source and ammonia similar to an MOCVD system. A Group III-Nitride layer can be deposited by flowing metal-chloride with carrier gas or HCl passing over a metal source and ammonia similar to a HVPE system. A Group III-Nitride layer can be deposited by a combination of metalorganic and metal chloride source along with ammonia. A Group III-Nitride can be deposited with different compositions under MOCVD in a first step and under HVPE condition in second step or vice versa.

In a particularly preferred embodiment a pressing gas is provided. The pressing gas creates flow in substantially a vertical/horizontal direction toward the substrate to bring the reaction gas in contact with the surface of the substrate. The pressing gas may flow from top to bottom (vertical) or bottom to top (upside down vertical geometry) or in a horizontal direction toward the substrate to bring the reaction gas in contact with the surface of the substrate. The pressing gas is preferably introduced through a shower head which has multiple shower ports and whose port size is uniform all over the shower head.

Figure 3:
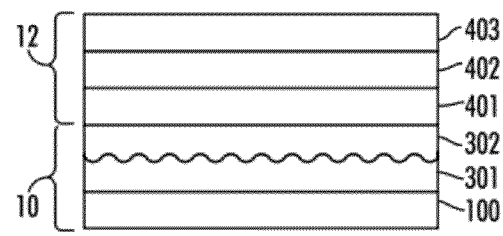
FIG. 3 is a schematic cross-sectional representation of an LED prepared in accordance with the present invention.

An embodiment of the invention will be described with reference to FIG. 3 wherein a schematic cross-sectional view is provided. In FIG. 3, a template, 10, includes a substrate, 100. A micro-undulated buffer layer, 301, is added onto the substrate. The micro-undulated layer will be more fully described herein. A second buffer, 302, is preferably applied to the first buffer. The second buffer layer forms a smooth surface upon which subsequent layers are formed. The substrate, 100, first buffer, 301, second buffer, 302, and subsequent buffer layers are taken together are referred to herein as a template. In an alternate embodiment the arrangement of micro-undulated layer and second buffer layer may be repeated such that a second micro-undulated layer is formed on the second buffer layer followed by an additional layer to form a smooth surface. This alternate layering of micro-undulated layer and smooth layer may be repeated multiple times.

An ultraviolet light-emitting structure, 12, is applied to the template, 10. In general, the ultraviolet light-emitting structure comprises a pair of semiconductor layers of opposing polarity separated by a quantum well layer. Each layer will be described further herein. The order of the semiconductor layers is not particularly limited with the proviso that eventual biasing is applied correctly. For the purposes of discussion the n-type semiconductor will be described as being deposited initially with the understanding that the reverse could be done in an analogous fashion.

The first semiconductor layer, 401, having a first type of conductivity is applied to the template. Though illustrated as a single layer the first semiconductor layer may be multiple layers wherein each layer has an elemental composition differing, or the same as, one or more adjacent layers.

A quantum well, 402, is applied to the first semiconductor layer, 401. The quantum well, though illustrated as a single layer, preferably comprises several layers forming a quantum-well region. It is most preferred that the quantum well have an emission spectrum ranging from 190 nm to 369 nm. The quantum well preferably comprises $Al_xIn_yGa_{1-X-Y}N$ wherein $0 \leq x \leq 1$, $0 \leq y \leq 1$, and $0 \leq x+y \leq 1$. The quantum well preferably has a surface and a band gap. A barrier layer is preferably on the surface of the quantum well and more preferably the quantum well region begins and terminates with said barrier layer. The barrier layer is made of $Al_xIn_yGa_{1-X-Y}N$ wherein $0<x \leq 1$, $0 \leq y \leq 1$ and $0<x+y \leq 1$ and has a band gap which is larger than the band gap of the quantum well. In one embodiment the quantum layer comprises alternating layers comprising $Al_xIn_yGa_{1-X-Y}N$ wherein $0 \leq x \leq 1$, $0 \leq y \leq 1$, and $0 \leq x+y \leq 1$.

The quantum well region begins and terminates with the barrier layer. The barrier layer preferably includes $Al_xIn_yGa_{1-X-Y}N$ wherein $0<x \leq 1$, $0 \leq y \leq 1$ and $0<x+y \leq 1$ and the quantum well and barrier layer have different compositions. The quantum well region preferably comprises a single quantum well and multiple quantum well layers. In one embodiment the quantum well is preferably doped with at least one n-type dopant with the most preferred intentional dopants selected from the group consisting of silicon, oxygen and indium and un-intentional doped carbon. In another embodiment the quantum well is doped with at least one p-type dopant preferably selected from the group consisting of magnesium, zinc and beryllium. In another embodiment the quantum well is doped with at least one n-type and at least one p-type dopant. It is particularly preferred that the quantum well region produces ultra-violet photons. In a preferred embodiment the quantum well region emits with a wavelength λ in the range 190 nm≦λ≦240 nm. In another preferred embodiment the quantum well region emits with a wavelength λ in the range 240 nm≦λ≦280 nm. In another preferred embodiment the quantum well region emits with a wavelength λ in the range 280 nm≦λ≦320 nm. In another preferred embodiment the quantum well emits with a wavelength λ in the range 320 nm≦λ≦369 nm.

A second semiconductor layer, 403, having a second type of conductivity than the first semiconductor layer is applied on the quantum well. Two metal contacts are ultimately applied to this construction, one to the semiconductor layer having the first type of conductivity and the other to the semiconductor layer having the second type of conductivity, to complete the LED. Each of these layers, and formation of contacts thereto will be described in detail below.

A micro-undulated layer is defined as a layer with a root mean square surface roughness ($R_{rms}$) of at least 10 Angstroms to no more than 10 µm. More preferably, a micro-undulated layer has a surface roughness of 10 angstrom to 2 µm. A micro-undulated layer thickness is a function of the roughness and is at least slightly larger than the $R_{rms}$ roughness. If the layer thickness is less than the roughness portions of the substrate may be left uncovered which is highly undesirable. If the layer thickness is much higher than the roughness no further benefit is obtained.

A micro-undulated layer may be bound by crystallographic faces with (0001), (1-100), (1011), (1-102), (11-20, (11-22) facets being most preferred.

A micro-undulated layer is deposited by controlling the flow of Group III (Ga, Al and In) precursors and Ammonia ($NH_3$). In one embodiment of invention, the micro-undulated layer is deposited at temperature ranging from 400-1000° C.

In another embodiment, the micro-undulated layer is deposited at a high Group V/III ratio ranging from 1000 to 500,000. A Group V precursor such as $NH_3$ or Nitrogen is modulated by decreasing and increasing the flux.

A micro-undulated layer preferably has a growth rate of about 60 Å to about 100 µm per hour with at least 0.2 µm per hour being most preferred.

A micro-undulated layer is preferably an AlGaN layer with ammonia flux flown constantly while the Group III precursor (Al and Ga in this case) is modulated by increasing or decreasing the sources flowing into chamber. The time taken to increase or decrease the flux ranges from at least 1 sec to about 120 secs and the flow is preferably stabilized at the increased or decreased flow conditions for at least 1 sec to about 120 secs.

The Group III precursor is preferably flown constantly while the Group V precursors such as $NH_3$ or nitrogen is modulated from 50 standard cubic centimeters per minute (sccm) to 10,000 sccm. The time taken to increase or decrease the Group V flux ranges from at least 1 sec to about 120 secs and is stabilized at the increased or decreased flow conditions for at least 1 sec to 120 secs.

In another way of depositing micro-undulated layer, the Group III and Group V precursor is flown constantly while the temperature is modulated from 400 to 1000° C. The conditions are created such that the micro-undulated surface formed.

The second buffer layer is preferably a smooth layer characterized by a root mean square surface roughness ($R_{rms}$) of less than 30 Angstroms and more preferably less than 10 Angstroms. A roughness of about 2-3 Angstroms has been successfully demonstrated. The second buffer layer thickness is a function of the roughness of the underlying micro-undulated layer with a thickness sufficiently thick to form a continuous layer being necessary. If the layer thickness of the second buffer layer is to small an adequate smoothness can not be obtained. If the layer thickness is too large no further benefit is obtained.

The second buffer layer is formed over the micro-undulated layer. The second buffer layer is deposited by controlling the flow of Group III (Ga, Al and In) precursors and Ammonia ($NH_3$). In one embodiment of invention, the second buffer layer is deposited at temperature ranging from 800-1300° C.

The second buffer layer is also defined as a layer having at least one surface preferably selected from (001), (110), (101), (102) or (114) facets.

The second buffer layer is deposited at a variable Group V/III ratio ranging from 0 to 100000. A Group V precursor such as $NH_3$ or Nitrogen is modulated by decreasing and increasing the flux.

The second buffer layer preferably has a growth rate of at least 0.01 µm hour and root mean square roughness ranging from 1 Å to 100 Å.

The second buffer layer is preferably an AlGaN layer with ammonia flux flown constantly while the Group III precursor (Al and Ga in this case) is modulated by increasing or decreasing the sources flowing into chamber. The time taken to increase or decrease the flux range from at least 1 sec to 60 secs and stabilize at the increased or decreased flow conditions for same flow for at least 1 sec to 120 mins.

The Group III precursor can be flown constantly while the Group V precursor, such as $NH_3$ or Nitrogen, is modulated from 0 sccm to 50,000 sccm. The time taken to increase or decrease the Group V flux range is at least 1 sec to about 120 secs and the flow is preferably stabilized at the increased or decreased flow conditions for at least 1 sec to about 120 secs.

In another way of depositing buffer, the Group III and Group V precursor is flown constantly while the temperature is modulated from 400 to 1800° C. The conditions are created such that the smooth surface is formed.

While not limited to any theory, it is hypothesized that the second buffer layer coalesces over the micro-undulated layer thereby mitigating dislocation defects in the underlying crystalline lattice.

Surface roughness, as referred to herein, is an arithmetic average of absolute values of vertical deviation of the roughness profile from the mean line which is referred to in the art as $R_a$. Surface roughness is measured in accordance with the ASME Y14.36M-1996 standard.

Each layer, other than the substrate, is made of a Group III-nitride, preferably $Al_xIn_yGa_{1-x-y}N$ (wherein $0<x\leq1$, $0\leq y\leq1$ and $0<x+y\leq1$). The precursor sources include a metal-organic source, ammonia, a carrier gas and, optionally, doping sources such as silane, and/or biscyclopentadienyl magnesium. The metal-organic source is preferably trimethyl aluminum, triethyl aluminum, trimethyl gallium, triethyl gallium, trimethyl boron, trimethyl iron, triethyl indium or trimethyl indium. The preferred carrier gas is hydrogen and/or nitrogen.

Figure 4:
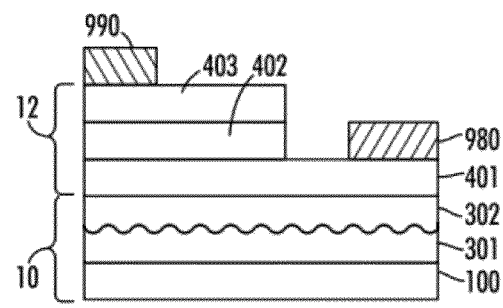
FIG. 4 is a schematic cross-sectional representation of an LED prepared in accordance with the present invention.

FIG. 4 illustrates template 10 with a layered, UV-emitting structure, 12, thereon, plus metal contacts 980 and 990. Except for metal contacts, 990 and 980, and the substrate, 100, all layers are preferably made of Group III-Nitride material.

With further reference to FIG. 4, the LED structure is grown beginning with Group III-Nitride first semiconductor layer, 401, with a first type of conductivity, applied directly on the second buffer, 302. It is preferred that the first semiconductor layer be an n+ layer made of $Al_xIn_{1-x}Ga_{1-x-y}N$ (wherein $0<x\leq1$, $0\leq y\leq1$ and $0<x+y\leq1$) formed such that the layer is transparent to the light to be emitted from the quantum well active region. Another Group III-Nitride layer, 402, is then formed which includes one or more barrier and one or more well sub-layers, each having different compositions such that the band-gap of the barrier layer is larger than that of the well layer. The thickness of the barrier and well layers should be between 1-200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Layer, 401, is given the first type of conductivity using silicon, or is co-doped using a combination of silicon, oxygen, and/or indium.

A p-type AlInGaN electron blocking layer, 403, is incorporated directly above the active region layer, 402, such that the band-gap of, 403, is larger than the bandgap of the barrier sublayer in, 402. Magnesium is preferably used as the p-type dopant. Additional p-type AlInGaN layers may be formed on top of, 403, such that the band-gap of the layers decreases for each subsequent layer. Subsequent layers may be one single AlInGaN layer, or may consist of a compositionally graded layer, a series of decreasing composition superlattices, or several distinct layers with decreasing bandgap to afford adequate adherence to the contact, 990.

A mesa-type LED may then be fabricated, the type shown in FIG. 4, using reactive ion etching (RIE) to access the bottom n+ layer. Finally, probe metal conducting pads, 980 and 990, are deposited on both the n+ and p+ layers, respectively. Ti/Al/Ti/Au and Ni/Au are used as metal contacts for the n- and p-contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such. As would be apparent the layer arrangement can be reversed without consequence.

In an alternative configuration, after construction the template may be removed by polishing, etching or lifting-off using a laser. A metallic contact, 980, can be applied to the backside the n-layer, 401. The p-contact, 990, could be attached to layer, 403.

Figures 5A, 5B, 5C:
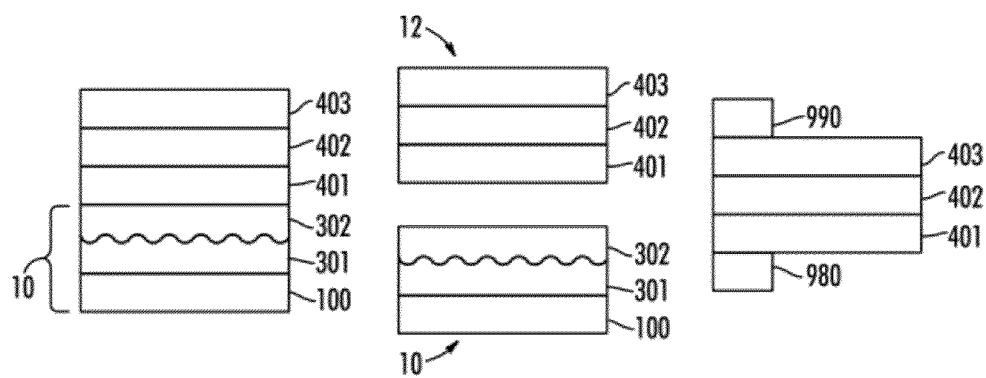
FIGS. 5a-5c are schematic cross-sectional representations of an LED prepared in accordance with the present invention.

An embodiment of the invention will be described with reference to FIG. 5 wherein a schematic cross-sectional representation of an embodiment is illustrated. In FIG. 5a the template, 10, comprising a substrate, 100, micro-undulated buffer layer, 301, and second buffer layer, 302, are as described previously. Similarly, the UV-emitting structure, 12, comprising semiconductor layers, 401 and 403, and quantum layer, 402, are as described above. In FIG. 5b the template, 10, is separated from the UV-emitting structure, 12. By removing the template the terminations, 980 and 990, can be placed directly on the semiconductor layers.

Figure 6:
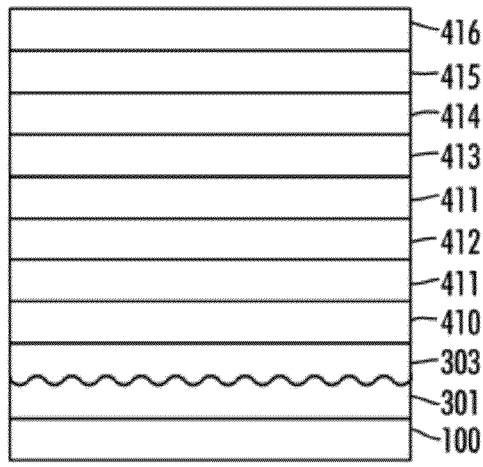
FIG. 6 is a schematic cross-sectional representation of an LED prepared in accordance with the present invention.

An embodiment of the invention will be described with reference to FIG. 6 wherein illustrated is a cross-sectional schematic view of an embodiment of the invention. In FIG. 6 a substrate, 100, is provided as described elsewhere herein. A micro-undulated layer, 301, is on the substrate wherein the micro-undulated layer is as described above. The second buffer layer, 303, is a graded buffer layer wherein the composition gradient is altered as a function of thickness such that it is similar to that of the micro-undulated layer at the interface with that layer and is similar to the composition of a contact layer, 410, at the interface with that layer. A barrier layer, 411, is on the contact layer, 410. A quantum well layer, 412, is sandwiched between two barrier layer, 411, and a hole tunneling layer, 413, is on the final barrier layer. The quantum well layer 412 and the barrier layer 411 can be a single layer or a multiple stack layer A ramp layer 414, which helps in minimizing the lattice mismatch and strain is on the hole tunneling layer. A graded layer, 415, has a composition gradient wherein the composition is similar to the composition of the ramp layer at that interface and similar to the composition of the contact layer, 416, at that interface.

The hole tunneling layer has a preferred thickness of 1 to 1000 Angstroms and a band gap of from 0.15 eV to 2.62 eV higher than the quantum well barrier layer band gap.

It is an ongoing desire to reduce resistance in a layer, and particularly, at the interface between layers. Resistance at the contact layers is a particular concern since this resistance is a source of heat. As current is increased the heat increases. This limits the current at which an LED can be operated. With silicon doping, this is a particular problem. The incorporation of indium in a layer has been surprisingly found to significantly reduce the resistance of a layer. Indium is particularly desirable in doped layers such as silicon doped or magnesium doped layers. At a given level of silicon doping, for example, incorporation of indium reduces the resistance thereby decreasing the heat generation which allows for an increase in the current at which the LED can be operated. In a silicon doped layer the indium is preferable present in an amount of atoms ranging from $10^{15}/cm^3$-$10^{24}/cm^3$. In a magnesium doped layer the indium is preferably present in an amount of atoms ranging from $10^{15}/cm^3$-$10^{24}/cm^3$.

Although preferably made of sapphire, the substrate may be made of silicon carbide, GaN, AlN, AlGaN, InN, InGaN, AlInGaN, Silicon, GaAs, $LiAlO_3$, $LiGaO_3$, ZnO, InP, InGaN InAlN, diamond, glass or a metal. In addition, the substrate has a crystallographic orientation along the C-plane, A-plane, M-plane or R-plane and has a mis-orientation ranging from 0.0° to 10° from its axis. The substrate preferably has a root mean square roughness ranging from 1 Å to 100 micron. The substrate can be polar, semi-polar or non-polar. The substrate can have at least one shape selected from, but not limited to, stripes, circles, stars, irregular shapes, rectangular shapes, squares, semi-circles, lines or dots.

Figure 7:
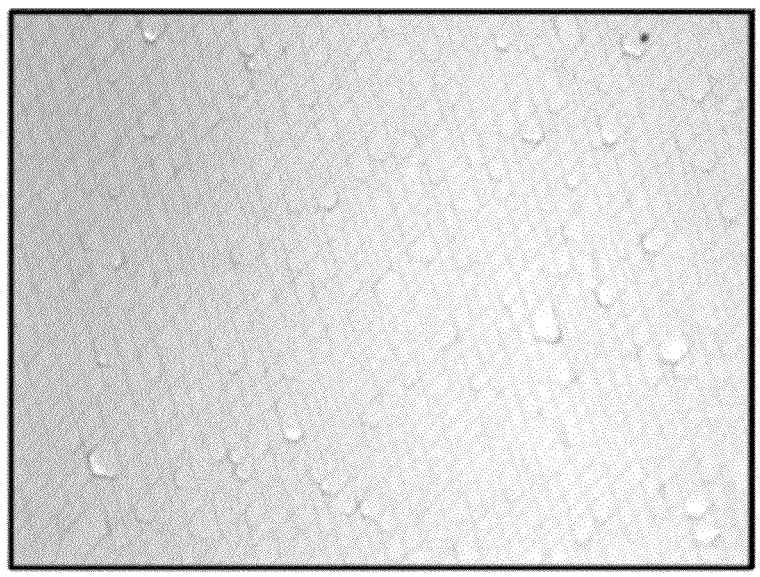
FIG. 7-9 are optical images of layers formed in accordance with the present invention.

FIG. 7 is an optical image of a 3 micron thick AlN layer directly grown on sapphire in accordance with the instant invention.

Figure 8:
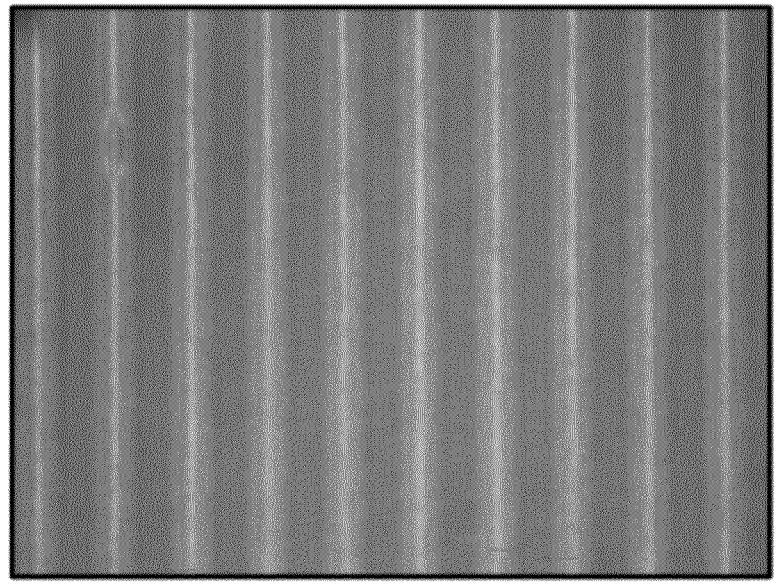

FIG. 8 is an optical image of an 8 micron thick AlN layer directly grown on a patterned Group III nitride templated sapphire in accordance with the instant invention.

Figure 9:
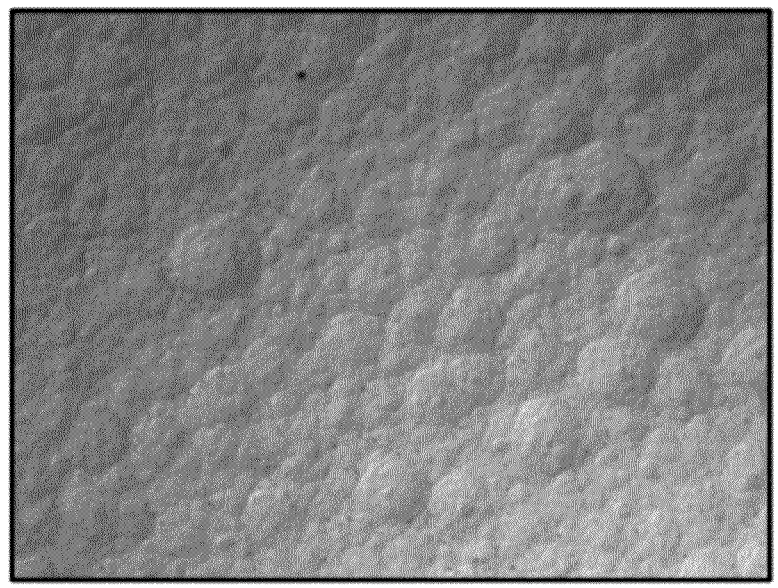

FIG. 9 is an optical image of an AlGaN layer grown in accordance with the present invention.

It will be apparent to those skilled in the art of ultraviolet light-emitting diodes and laser diodes that many modifications and substitutions can be made to the preferred embodiments described herein without departing from the spirit and scope of the present invention which is specifically set forth in the appended claims.

What is claimed is:

1. A method of forming a Group III-V semiconductor crystal layer over a substrate comprising the steps of:
   heating said substrate in a primary chamber to a first temperature;
   supplying a gaseous flow of a metal-organic compound to said primary chamber;
   passing hydrogen chloride gas over a metal source at a second temperature to form a metal chloride wherein said second temperature is lower than said first temperature;
   supplying said metal chloride to said primary chamber; and
   supplying a gaseous flow of a nitrogen source to said primary chamber;
   wherein at least one of said metal chloride and said metal-organic reacts with nitrogen of said nitrogen source to form a Group III-V semiconductor crystal layer on said substrate.

2. The method for forming a Group III-V semiconductor of claim 1 further comprising a second metal chloride.

3. The method for forming a Group III-V semiconductor of claim 2 further comprising a carrier gas source comprising carrier gas wherein said carrier gas is capable of transporting at least one of said metal chloride, said nitrogen, said metal organic and said second metal chloride to said primary chamber.

4. The method for forming a Group III-V semiconductor of claim 1 comprising heating said primary chamber to a temperature of from 400 to 1800° C.

5. The method for forming a Group III-V semiconductor of claim 1 comprising heating said metal chloride to a temperature of from 50 to 600° C.

6. The method for forming a Group III-V semiconductor of claim 1 comprising heating said metal chloride to a temperature of from 100 to 150° C.

7. The method for forming a Group III-V semiconductor of claim 1 wherein said metal-organic is selected from the group consisting of trimethyl aluminum, trimethyl gallium, triethylgallium, trimethyl indium, triethyl aluminum, triethyl indium, trimethyl boron and triethyl boron.

8. The method for forming a Group III-V semiconductor of claim 1 wherein said metal is selected from the group consisting of gallium, aluminum, indium, magnesium, boron.

9. The method for forming a Group III-V semiconductor of claim 1 wherein said nitrogen source is ammonia.

10. The method for forming a Group III-V semiconductor of claim 1 wherein flow of at least one of said metal chloride, said nitrogen, said metal organic and said second metal chloride is pulsed.

11. The method for forming a Group III-V semiconductor of claim 1 further comprising rotating said substrate during said formation of Group III-V semiconductor crystal layer on said substrate.

12. The method for forming a Group III-V semiconductor of claim 1 wherein said Group III-V semiconductor is formed by at least one method selected from the group consisting of MOCVD, PALE and HVPE.

13. The method for forming a Group III-V semiconductor of claim 12 wherein said Group III-V semiconductor is formed by a combination of methods selected from the group consisting of MOCVD, PALE and HVPE.

14. The method for forming a Group III-V semiconductor of claim 1 further comprising providing a pressing gas.

15. The method for forming a Group III-V semiconductor of claim 14 wherein said pressing gas directs precursor flow.

16. An LED made by the method of claim 1.

17. A device for forming a Group III-V semiconductor on a substrate comprising:
   a primary chamber comprising a substrate and a heat source for heating said substrate to a first temperature;
   a secondary chamber comprising a metal source and a second heat source for heating said secondary chamber to a second temperature wherein said second temperature is lower than said first temperature;
   a first source capable of providing HCl to said secondary chamber wherein said HCl and said metal form metal chloride;
   a first carrier gas capable of transporting said metal chloride to said primary chamber;
   a metal-organic source capable of containing a metal-organic;
   a second carrier gas capable of transporting said metal-organic from said metal-organic source to said primary chamber;
   a second metal chloride source comprising a second metal chloride;
   a third carrier gas capable of transporting said second metal chloride to said primary chamber;
   a nitrogen source comprising a nitrogen containing compound; and
   a fourth carrier gas capable of transporting said nitrogen containing compound to said primary chamber;
   wherein at least one of said metal chloride, said metal-organic and said second metal chloride react with said nitrogen containing compound to form a Group III-V semiconductor on said substrate.

18. The device of claim 17 wherein said at least two of said first carrier gas, said second carrier gas, said third carrier gas and said fourth carrier gas are from a common supply.

19. The device of claim 18 further comprising a carrier gas source comprising carrier gas wherein said carrier gas is capable of transporting at least one of said metal chloride, said nitrogen, said metal organic and said second metal chloride to said chamber.

20. The device of claim 17 comprising heating said primary chamber to a temperature of from 400 to 1800° C.

21. The device of claim 17 comprising heating said secondary chamber to a temperature of from 50 to 600° C.

22. The device of claim 17 comprising heating said metal chloride to a temperature of from 100 to 150° C.

23. The device of claim 17 wherein said metal-organic is selected from the group consisting of trimethyl aluminum, trimethyl gallium, triethylgallium, trimethyl indium, triethyl aluminum, triethyl indium, trimethyl boron and triethyl boron.

24. The device of claim 17 wherein said metal is selected from the group consisting of gallium, aluminum, indium, magnesium, boron.

25. The device of claim 17 wherein said nitrogen source is ammonia.

26. The device of claim 17 wherein flow of at least one of said metal chloride, said nitrogen, said metal organic and said second metal chloride is pulsed.

27. The device of claim 17 further comprising a substrate rotator.

28. The device of claim 17 operable in at least one mode selected from the group consisting of MOCVD, PALE and HVPE.

29. The device of claim 28 operable in a combination of modes selected from the group consisting of MOCVD, PALE and HVPE.

30. The device of claim 17 further comprising a pressing gas.

31. The device of claim 30 wherein said pressing gas directs precursor flow.

* * * * *